(12) United States Patent
Truett

(10) Patent No.: US 7,271,356 B2
(45) Date of Patent: Sep. 18, 2007

(54) HYBRID LIMIT SWITCH

(76) Inventor: Brett B. Truett, 1908 Briar Ave., Utica, NY (US) 13501

( * ) Notice: Subject to any disclaimer, the term of this patent is extended or adjusted under 35 U.S.C. 154(b) by 1067 days.

(21) Appl. No.: 10/003,590

(22) Filed: Oct. 31, 2001

(65) Prior Publication Data

US 2003/0079972 A1    May 1, 2003

(51) Int. Cl.
*H01H 15/14* (2006.01)
*H01H 17/12* (2006.01)

(52) U.S. Cl. ......................................... 200/47; 200/341

(58) Field of Classification Search .................. 200/47, 200/341, 249, 447
See application file for complete search history.

(56) References Cited

U.S. PATENT DOCUMENTS

| | | | |
|---|---|---|---|
| 5,190,150 A * | 3/1993 | Laue et al. | 200/341 |
| 5,890,585 A * | 4/1999 | Nakamura et al. | 200/47 |
| 5,959,271 A * | 9/1999 | Matsuhashi | 200/61.41 |
| 6,518,528 B2 * | 2/2003 | Nickerson et al. | 200/447 |
| 6,653,583 B1 * | 11/2003 | Asa | 200/249 |

* cited by examiner

*Primary Examiner*—Richard K. Lee
(74) *Attorney, Agent, or Firm*—Robert O. Wright

(57) ABSTRACT

A hybrid limit/proximity switch combining the standard limit switch operator head and a proximity sensor in a body that may be interchangeably mounted on a machine in place of a conventional mechanically operated limit switch is disclosed.

20 Claims, 4 Drawing Sheets

HYBRID LIMIT SWITCH

This invention relates to a hybrid limit switch and proximity switch and more particularly to a module for enabling the quick and easy assembly of custom hybrid limit switch/proximity switch devices for use in controlling various types of apparatus.

BACKGROUND OF INVENTION

For many years modern machinery control has been accomplished by the use of electro-mechanical limit switches. The conventional limit switch has usually consisted of an operator head with a movable actuator that is displaced by a machine element, which in turn has displaced a mechanically operated electro-mechanical set of contacts which results in an electrical signal that can be used to control various machine elements. These limit switches have been refined over the years to the point where they have become extremely rugged with a wide variety of operator heads and actuators from which designers can choose. Actuators have included single and double rollers, fixed and adjustable levers, buttons, spring rods, cat whiskers, etc. All have been mounted in universal operator heads that fit on standard bodies containing a mechanically operated electro-mechanical set of contacts.

In more recent years solid state proximity sensors have been used for many applications formerly controlled with limit switches. Proximity sensors eliminate the need for physical contact, are solid state, computer compatible and environmentally sealed in construction and have no moving parts. Generally these new proximity sensors have taken the form of cylindrical tubes, sometimes externally threaded, with the components generally completely encapsulated therein.

Despite the advantages of proximity sensors many users continue to use the old limit switches because of the cost of conversion, redesign of machines and control hardware, replacement parts inventory and other reasons.

OBJECTS AND SUMMARY OF THE INVENTION

Accordingly it is an object of the present invention to provide a limit switch/proximity switch that overcomes the limitations of the prior art. It is another object of the present invention to provide a switch module that is completely compatible with both limit switch operator heads and actuators and cylindrical proximity sensors.

It is a further object of the present invention to provide a switch module in which the body portion may be interchangeably mounted on a machine in place of a limit switch and yet accept both the conventional limit switch operator head and a cylindrical proximity sensor.

It is a further object of the present invention to provide a hybred limit switch/proximity sensor that may be interchangeably used in existing and new limit switch applications without design or hardware changes except for the substitution of a proximity switch for a mechanically operated set of contacts.

It is a still further object of the present invention to provide a hybrid limit switch/proximity sensor in which the standard limit switch mechanism needs only minimal modification to actuate a proximity sensor.

It is yet another object of the present invention to provide an article of manufacture and method of making same in which a limit switch operator head and a proximity sensor are encapsulated in a molded body interchangeable with a standard limit switch body.

These and other and further objects are achieved in one embodiment of the present invention wherein a generally rectangular plastic block approximately the size and shape of a limit switch body and having identical mounting holes, is provided with a cylindrical bore adapted to receive a proximity switch in one end and a limit switch operator head in the other end.

DESCRIPTION OF PREFERRED EMBODIMENTS

Figure 1:
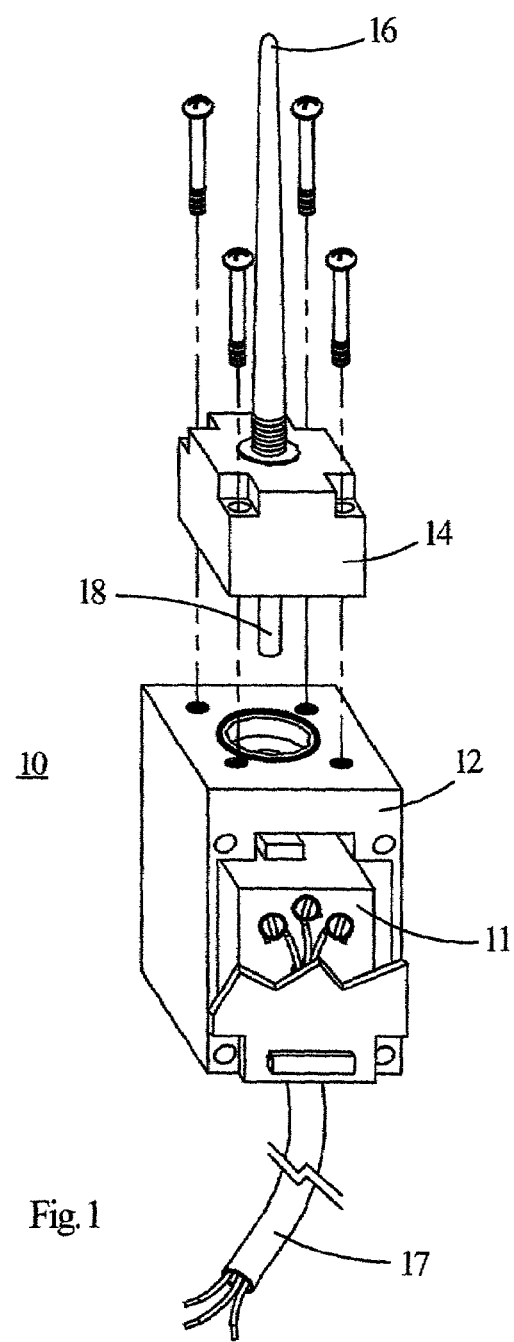
FIG. 1 is an exploded perspective view of a prior art limit switch showing a typical body, operator head, electric contact block and actuator.

Referring now to FIG. 1 a typical prior art limit switch 10 is shown which has a body portion 12, an operator head 14, an actuator arm 16, and connector wires 17 extending from a mechanically operated contact block 11 positioned within body 12. In operation movement of actuator 16 causes operator head plunger 18 to extend into body 12 and actuate the contact block 11 therein to send an electrical signal.

Figure 2:
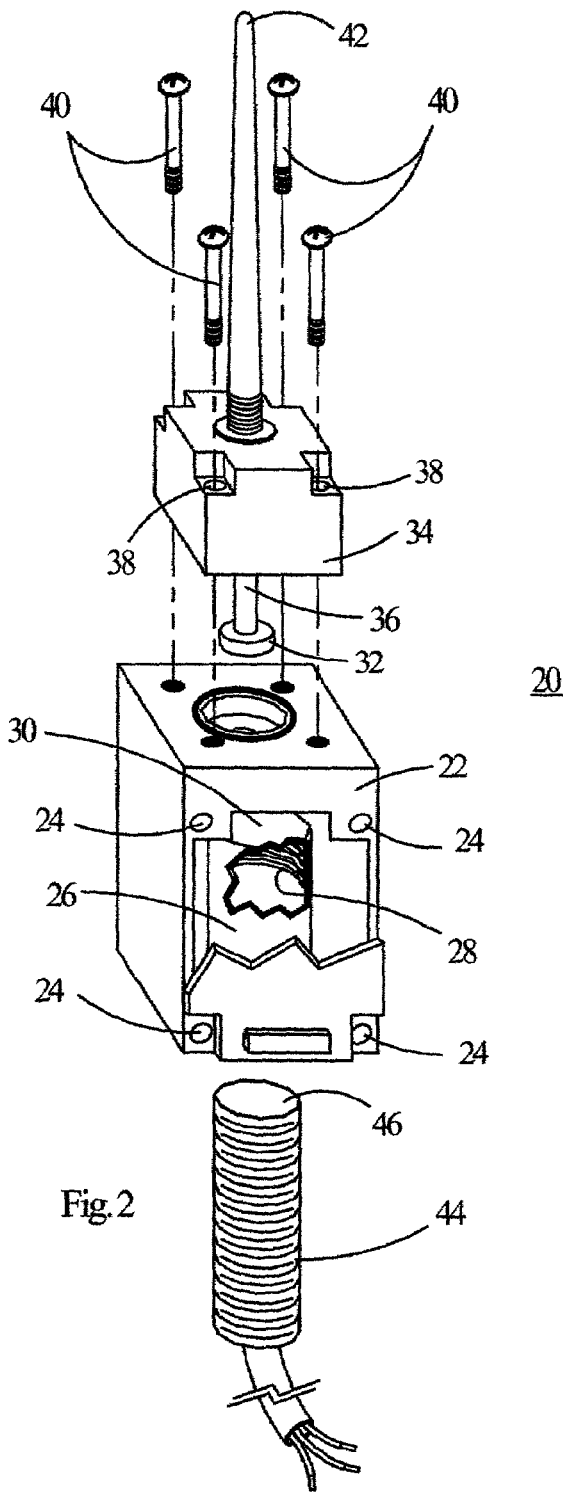
FIG. 2 is an exploded perspective view, partially cut away, of an hybrid limit switch/proximity switch according to the present invention.

Referring now to FIG. 2 a switch 20 according to the present invention has a body 22, generally rectangular in shape, and a series of mounting holes 24 positioned therein in exact replica of the holes in body 12 of FIG. 1. A cylindrical bore 26, threaded at one end 28 is formed through the longitudinal length of body 22 and is sized to receive at the unthreaded end 30 a usually metal target 32 mounted on the end of shaft 36 extending out of operator head 34. Operator head 34 is a typical "cat whisker" operator, one of the many types of traditional limit switch heads, and has a shaft 36 extending out of the bottom thereof. Four holes 38 are formed in the corners of the head body and allow mounting by screws 40 to body 22. This standard configuration also allows mounting of head 34 to a traditional limit switch body such as body 12. A standard actuator arm 42 is shown operatively connected to the shaft 36 similarly to the mounting of arm 16 in FIG. 1.

Proximity sensor 44 is an elongated cylinder, threaded on the outside and sized to thread into the threaded end 28 of bore 26 of body 22. When assembled proximity sensor 44 is threaded into bore 26 a distance sufficient to bring the distal end 46 into operative relationship with target 32 of head 34, when the head 34 is mounted on the end of body 22. Thus when actuator arm 42 is moved by contact with a machine element the target 32 will be moved into operative relationship with end 46 of sensor 44 so as to actuate the proximity sensor 44 to create an electrical signal.

Figure 3:
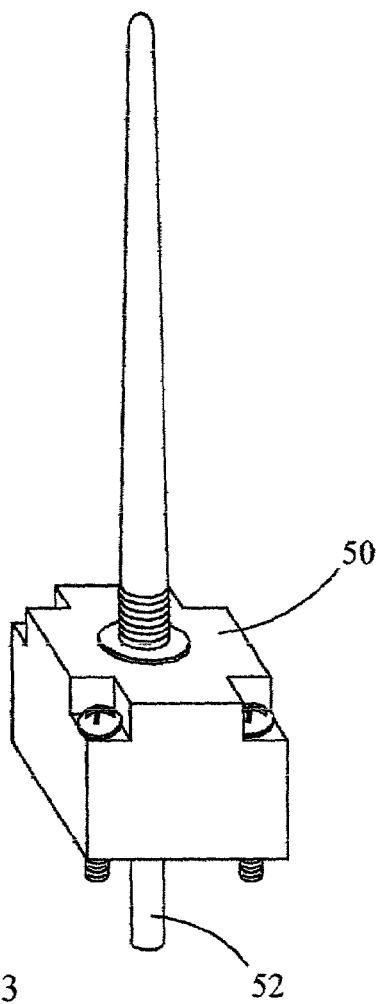
FIG. 3 is a perspective view of a typical prior art limit switch operator head.
Figure 4:
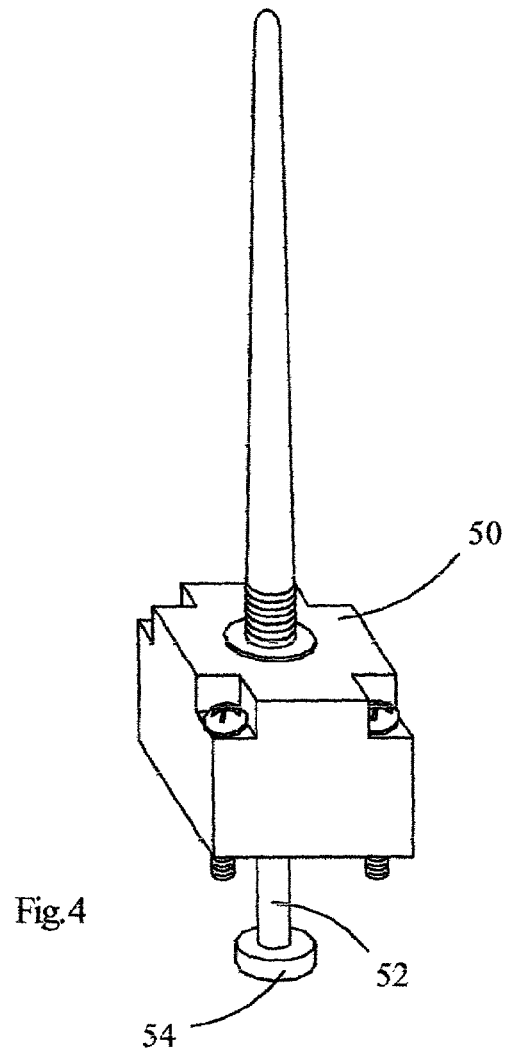
FIG. 4 is a view similar to FIG. 3 showing an operator head according to the present invention with a plunger modified with a target.

Referring now to FIGS. 3 & 4 there is shown a typical operator head 50. To operate a typical inductive proximity sensor a metal target must be moved into operative relation with the sensor end. Some operator head shafts such as 52 in FIG. 3 are plastic, do not have sufficient mass or cannot be moved close enough to actuate a proximity sensor. Accordingly a target 54 FIG. 4, is secured on the end of the operator head shaft 52 before mounting on a body such as shown in FIG. 2. This ensures proper operation of the limit/proximity switch.

Figure 5:
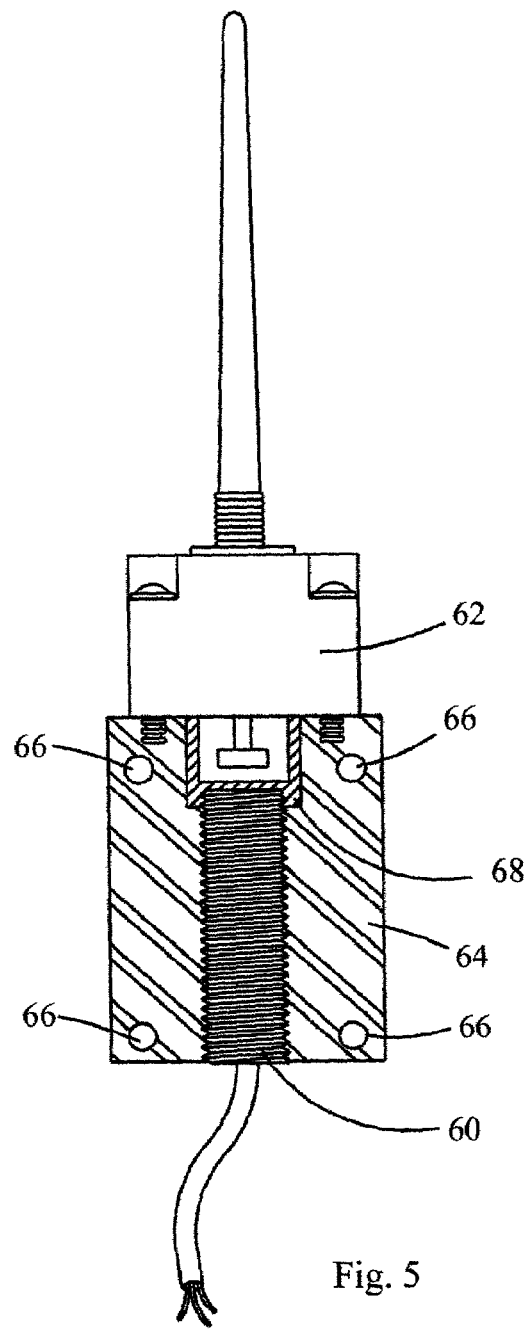
FIG. 5 is a sectional view of a proximity switch and a limit switch operator encapsulated in a single molded body.

Referring now to FIG. 5 there is shown another embodiment of the present invention. In one form of this embodiment a proximity sensor 60 and an operator head 62 are placed in a mold (not shown) and a molded body 64 is formed about them securing them in fixed operative relationship. Body 64 may be formed of any appropriate plastic material such as a thermoplastic resin material or any of the powdered metal or composite molding materials. The body 64 generally has the same size and shape as body 22, FIG. 2, with mounting holes 66 positioned to permit mounting in place of a traditional limit switch. The result is a fully encapsulated limit/proximity switch that is interchangeable with conventional limit switches yet offers the advantages of proximity sensor operation.

Figure 6:
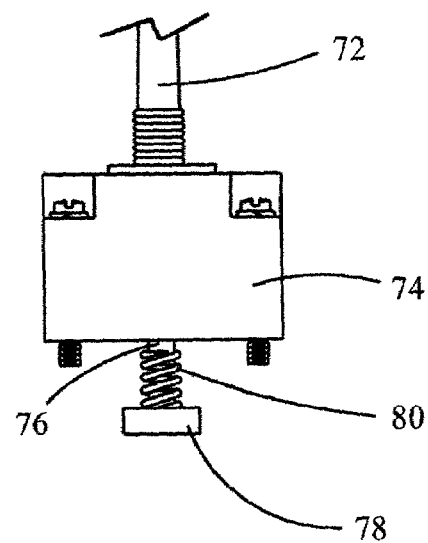
FIG. 6 is a partial view similar to FIG. 4 of another embodiment of the invention.

Referring now to FIG. 6 there is shown a modification particularly useful in certain applications. A typical operator head 74 and "cat whisker" 72 have attached to shaft 76 a special target 78 attached to shaft 76 via spring 80. The relatively large displacement of limit switch operators must sometimes be matched to proximity sensors requiring very small movement or close placement of the target for actuation. In these situations the target must be spring loaded to prevent "crashing" of the target into the sensor or limiting of the operator travel. Thus target 78 is mounted on one end of spring 80 and spring 80 is attached to shaft 76 at its other end.

Figure 7:
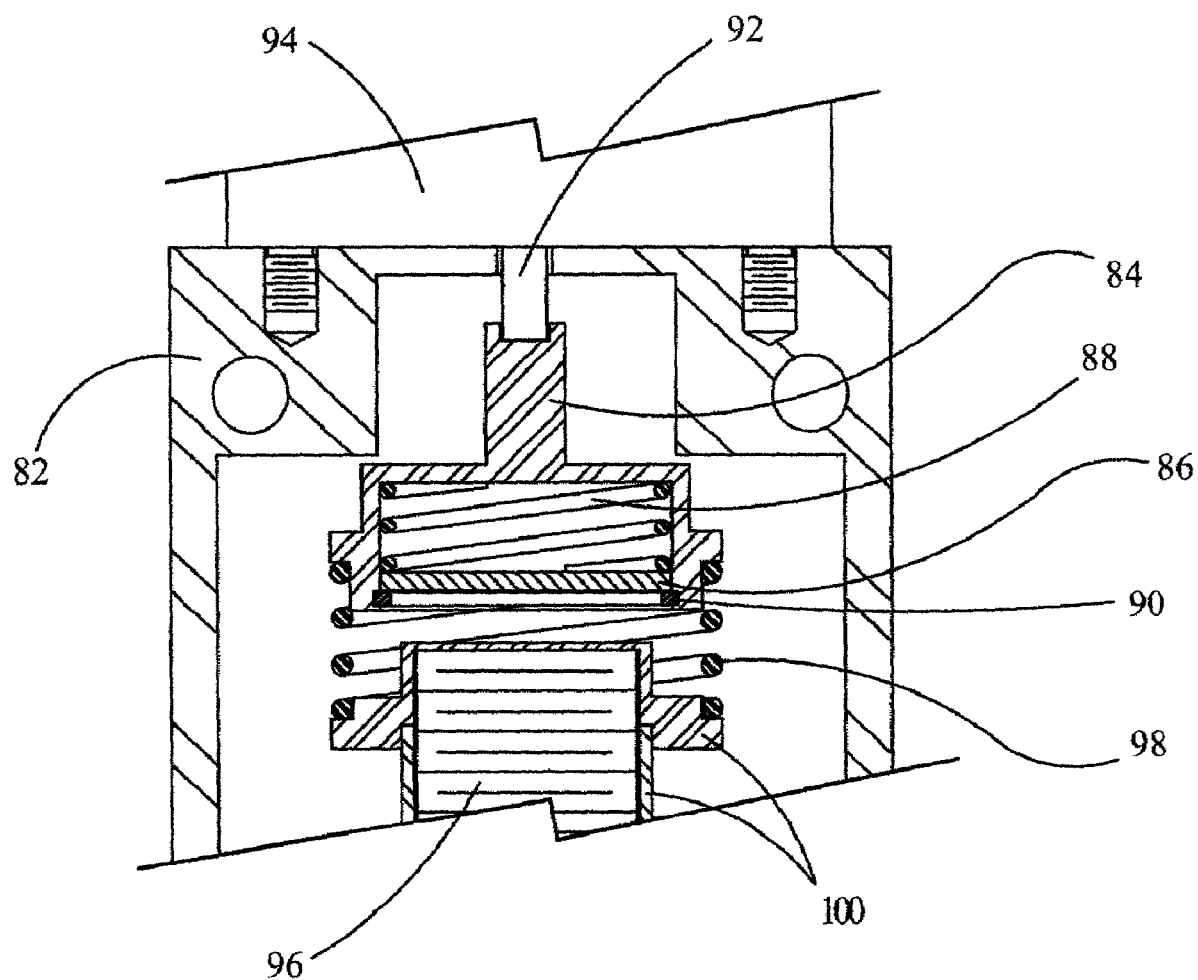
FIG. 7 is a partial sectional view of a still further embodiment of the invention.

In some installations the operator head must be removed periodically from the limit switch body and the FIG. 6 embodiment may present problems. FIG. 7 shows a target and mounting contained within the limit switch body permitting use of limited movement proximity sensors and standard large displacement switch operators. Thus limit switch body 82 is provided with a target housing 84 which carries target 86 spring biased by overtravel spring 88 to the lower limits of the housing 84 and held there by retaining ring 90. Housing 84 is contacted by shaft 92 of the operator head 94. Housing 84 is sized to fit over proximity sensor 96 so as to bring target 86 into operative relationship with the sensor 96. The target housing 84 and sensor housing 100 both have an annular boss on the exterior surface thereof and a "pre-travel" spring 98 fitting over the exterior of both is positioned to cushion any overtravel caused by the standard switch operator head. With this embodiment the operator head may be removed without interfering with or damaging the target 86 or the sensor 96.

While there are given above certain specific examples of this invention and its application in practical use, it should be understood that they are not intended to be exhaustive or to be limiting of the invention. On the contrary, these illustrations and explanations herein are given in order to acquaint others skilled in the art with this invention and the principles thereof and a suitable manner of its application in practical use, so that others skilled in the art may be enabled to modify the invention and to adapt and apply it in numerous forms each as may be best suited to the requirement of a particular use.

I claim:

1. A module for use in making a limit switch for selectively making and breaking an electrical circuit which comprises in combination:
    a body portion having a plurality of holes, extending therethrough, for mounting said body portion to an object and having first and seconds ends;
    a mechanical operator head mounted on said first end of said body portion;
    an actuator arm member for contacting an object operatively mounted on said operator head;
    target means mounted in said operator head and operatively connected to said actuator arm member;
    said target means being positioned so as to selectively extend into said body portion in operative relationship with a proximity sensor when a proximity sensor is positioned in said second end;
    whereby when a module is assembled into a complete limit switch mounted on an object and said actuator arm member contacts a movable portion of said object said target means is moved to actuate a proximity sensor positioned in said body second end to make/break an electrical circuit.

2. The invention as claimed in claim 1 wherein said body portion is a hollow elongated member having a generally rectangular outer cross section;
    a cylindrical threaded hole is formed in said second end; and
    said target means extends into said hollow elongated member from said first end.

3. The invention as claimed in claim 1 wherein said body portion is a rectangular plastic block with a cylindrical bore extending from said first end to said second end;
    said bore adjacent said second end is internally threaded to receive therein an externally threaded proximity sensor;
    said operator head target means extends into said bore at said first end in juxtaposed operating position with a proximity sensor when positioned in said second end.

4. The invention as claimed in claim 3 wherein said plurality of holes extending through said plastic block are located therein so as to match the positions of the mounting holes in a standard limit switch body member.

5. A limit switch for selectively making and breaking an electrical circuit which comprises in combination:
    a body portion having a plurality of holes, extending therethrough, for mounting said body portion to an object and having first and second ends;
    a mechanical operator head mounted on said first end of said body portion;
    an operator member for contacting an object operatively mounted on said operator head;
    a proximity sensor mounted in said second end of said body portion;
    target means mounted in said operator head and operatively connected to said operator member;
    said target means being positioned so as to selectively extend into operative relationship with said proximity sensor;
    whereby when said operator member contacts an object said target means is moved to actuate said proximity sensor to make or break an electrical circuit.

6. The invention as claimed in claim 5 wherein said body portion is a hollow elongated member having a generally rectangular outer cross section;
 a cylindrical threaded hole is formed in said second end;
 said proximity sensor is a cylindrical threaded member adapted to thread into said cylindrical threaded hole;
 said target means extends into said hollow elongated member from said first end so that upon movement of said operator member said target means is moved to actuate said proximity sensor.

7. The invention as claimed in claim 6 wherein said operator member is a spring rod.

8. The invention as claimed in claim 5 wherein said body portion is a rectangular plastic block with a cylindrical bore extending from said first end to said second end;
 said bore adjacent said second end is internally threaded;
 said proximity sensor is externally threaded and adjustably mounted in said threaded bore portion;
 said operator head target means extends into said bore at said first end in juxtaposed operating position with said proximity sensor positioned in said second end.

9. The invention as claimed in claim 8 wherein said plurality of holes extending through said plastic block are located therein so as to match the positions of the mounting holes in a standard limit switch body member.

10. The invention as claimed in claim 5 wherein said mechanical operator head is a limit switch operator head;
 said operator head includes a rotatable shaft extending therefrom; and
 said operator member is mounted on said rotatable shaft.

11. The invention as claimed in claim 10 wherein said operator member is an object contacting arm adjustably mounted on said shaft; and
 a roller member is mounted on the object contacting end of said arm.

12. The invention as claimed in claim 5 wherein said operator head includes a linearly retractable member extending therefrom; and
 said operator member is a roller rotatably mounted on the end of said retractable member.

13. The invention as claimed in claim 5 wherein said operator head includes a linearly retractable member extending therefrom; and
 said operator member is a button fixed on the distal end of said retractable member.

14. A body module for use in making a limit/proximity switch to make/break an electrical circuit comprising:
 an elongated generally rectangular plastic block having first and second ends;
 a longitudinal cylindrical bore formed in said block extending from first to second end thereof;
 a plurality of transverse mounting holes formed in said block adjacent the corners thereof;
 said mounting holes being formed in a pattern to match the mounting holes in the body portion of a standard limit switch; and
 said cylindrical bore having an internally threaded portion adjacent one end.

15. The invention as claimed in claim 14 further including a mechanical operator head mounted on said first end of said body portion; and
 an actuator member for contacting an object operatively mounted on said mechanical operator head.

16. The invention as claimed in claim 15 wherein said operator head includes a rotatable shaft extending therefrom;
 said actuator member is an object contacting arm adjustably mounted on said shaft; and
 a roller member is mounted on the object contacting end of said arm.

17. The invention as claimed in claim 15 wherein said operator head includes a linearly retractable member extending therefrom; and
 said actuator member is a roller rotatably mounted on the end of said retractable member.

18. The invention as claimed in claim 15 wherein said operator head includes a linearly retractable member extending therefrom; and
 said actuator member is a button fixed on the distal end of said retractable member.

19. The invention as claimed in claim 15 wherein said actuator member is a cat whisker spring rod.

20. The invention as claimed in claim 14 further including a target assembly mounted in the end of said cylindrical bore opposite said threaded portion;
 said target assembly having first and second ends and adapted at said first end to operatively engage an operator head when installed on said body module;
 a target member movably mounted within said target assembly; and
 an over travel spring mounted in said target assembly so as to bias said target member toward said assembly second end;
 whereby when an operator head and proximity sensor are installed on said body module and an actuator member of said operator head moves said target assembly toward said proximity sensor, said over travel spring will prevent "crashing" of said target into said proximity sensor.

* * * * *